(12) United States Patent
Harvey et al.

(10) Patent No.: US 7,193,416 B2
(45) Date of Patent: Mar. 20, 2007

(54) OPEN MAGNETIC RESONANCE IMAGING (MRI) MAGNET SYSTEM

(75) Inventors: Paul Royston Harvey, Eindhoven (NL); Johannes Adrianus Overweg, Uelzen (DE); Cornelis Leonardus Gerardus Ham, Eindhoven (NL); Nicolaas Bernardus Roozen, Eindhoven (NL); Patrick Willem Paul Limpens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 202 days.

(21) Appl. No.: 10/498,198

(22) PCT Filed: Nov. 20, 2002

(86) PCT No.: PCT/IB02/04911

§ 371 (c)(1),
(2), (4) Date: Jun. 9, 2004

(87) PCT Pub. No.: WO03/050555

PCT Pub. Date: Jun. 19, 2003

(65) Prior Publication Data

US 2005/0068032 A1 Mar. 31, 2005

(30) Foreign Application Priority Data

Dec. 10, 2001 (EP) .................................. 01204743

(51) Int. Cl.
*G01V 3/00* (2006.01)
(52) U.S. Cl. ...................................................... 324/318
(58) Field of Classification Search ................. 324/318
See application file for complete search history.

(56) References Cited

U.S. PATENT DOCUMENTS

| 5,489,848 A | * | 2/1996 | Furukawa .................... 324/318 |
| 5,554,929 A |   | 9/1996 | Doty et al. |
| 5,581,187 A | * | 12/1996 | Pausch ....................... 324/318 |

(Continued)

FOREIGN PATENT DOCUMENTS

| EP | 0 770 883 A1 | 2/1997 |
| EP | 0 773 450 A1 | 5/1997 |
| WO | WO 99 54747 | 10/1999 |

*Primary Examiner*—Louis M. Arana
(74) *Attorney, Agent, or Firm*—Fay, Sharpe, Fagan, Minnich & McKee

(57) ABSTRACT

The invention relates to an open magnetic resonance imaging (MRI) magnet system (1) for use in a medical imaging system. The open MRI magnet system has two main coil units which are accomodated, at some distance from each other, in a first housing (2) and in a second housing (3), respectively. Between the two housings, an imaging volume (6) is present wherein a patient to be examined is placed. A gradient coil unit (9, 10) facing the imaging volume is present near a side of each of the two housings. Functional connections of the gradient coil units (9, 10), such as electrical power supply lines (13, 14) and cooling channels (15, 16) are provided in a central passage (4, 5) which is present in each of the two housings. As a result, these functional connections do not reduce the space in the imaging volume available for the patient. The central passages and the electrical power supply lines provided therein are parallel to the direction of the main magnetic field of the open MRI magnet system, so that the Lorentz forces exerted on the power lines are limited.

10 Claims, 1 Drawing Sheet

U.S. PATENT DOCUMENTS

| | | | |
|---|---|---|---|
| 5,631,561 A * | 5/1997 | Stetter | 324/322 |
| 5,841,279 A | 11/1998 | Hayashi et al. | |
| 6,147,495 A * | 11/2000 | DeMeester et al. | 324/320 |
| 6,154,110 A | 11/2000 | Takeshima | 335/299 |
| 6,218,838 B1 * | 4/2001 | McGinley et al. | 324/320 |
| 6,236,207 B1 | 5/2001 | Arz et al. | |
| 6,335,670 B1 * | 1/2002 | Kinanen | 335/296 |
| 6,404,199 B1 * | 6/2002 | Fujita et al. | 324/318 |
| 6,445,184 B1 * | 9/2002 | Tanttu | 324/309 |
| 6,552,545 B2 * | 4/2003 | Kaindl et al. | 324/318 |
| 6,774,631 B2 * | 8/2004 | Heid | 324/318 |

* cited by examiner

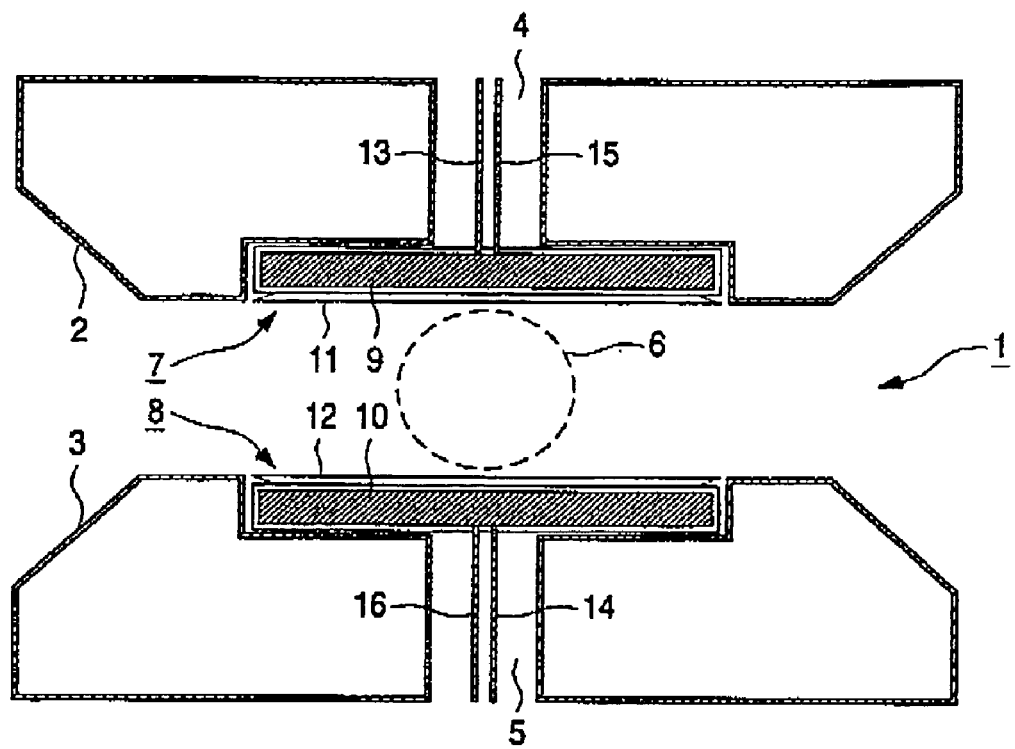
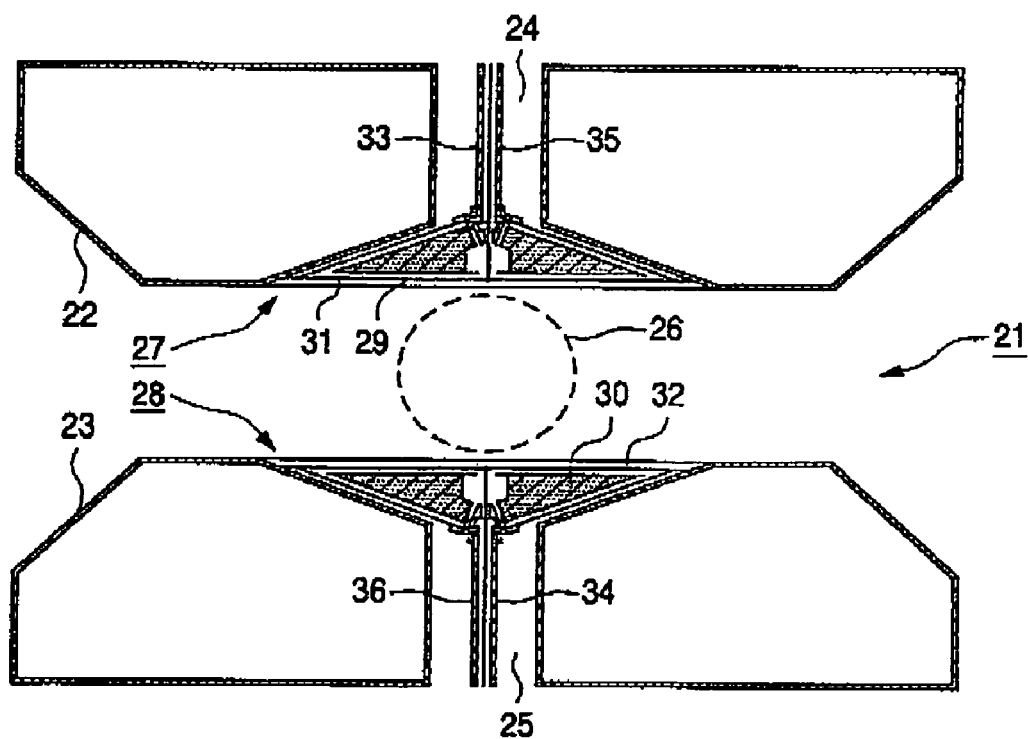

OPEN MAGNETIC RESONANCE IMAGING (MRI) MAGNET SYSTEM

BACKGROUND

The invention relates to an open magnetic resonance imaging (MRI) magnet system comprising a first mainly ring-shaped main coil unit and a second mainly ring-shaped main coil unit extending parallel and at some distance from each other and defining therebetween an imaging volume, a first housing and a second housing which accommodate respectively the first main coil unit and the second main coil unit, at least the first housing having a central passage, the open MRI magnet system further comprising a first gradient coil unit and a second gradient coil unit associated with respectively the first main coil unit and the second main coil unit, the first gradient coil unit and the second gradient coil unit respectively being positioned between the associated main coil unit and the imaging volume, each gradient coil unit being provided with functional connections.

The invention further relates to a medical imaging system comprising an open magnetic resonance imaging (MRI) magnet system.

SUMMARY

An open MRI magnet system and a medical imaging system as mentioned in the opening paragraphs are known from European patent application EP-A1-0 770 883. In this patent document an open MRI magnet system is described having two coaxially aligned toroidal-shaped housings which each accommodate an annular-shaped superconductive main coil unit immerged in a cryogenic fluid. A generally non-permanently magnetized ferromagnetic ring is located at an inner corner of each of the associated housings. Centrally between the two housings a spherical imaging volume is present. In order to be able to create an image of a patient for medical-diagnostical reasons, this patient should be present within this imaging volume. The open structure of such an open MRI magnet system prevents or reduces claustrophobia feelings of patients which are more likely to occur when so-called closed magnet systems having an imaging volume within a single, tubular-shaped coil assembly are being used. Whereas the two main coil units create a magnetic field between them within the imaging volume which is necessary to be able to produce an image of an object such as a patient within the imaging volume, the generally non-permanently magnetized ferromagnetic rings are present for further homogenization of the magnetic field within the imaging volume.

Usually, such an open MRI magnet system comprises gradient coil units which are provided with functional connections, e.g. electrical connections. The gradient coil units serve in general for generating a switchable magnetic field, which is more or less linear in space, within the imaging volume as will be known to those skilled in the art. Usually, the functional connections are provided in the imaging volume, as a result of which the space available for the patient is reduced. In this respect it should be realized that by increasing the distance between the main coil units in order to increase the available space in the imaging volume, also the costs related with the open MRI magnet system increase drastically.

It is an object of the invention to provide an open MRI magnet system and a medical imaging system of the kinds mentioned in the opening paragraphs in which the functional connections are provided in such a way that the available space for an object in general or, more specifically, the available patient space for manipulation of a patient is optimized without the necessity to increase the distance between the main coil units.

In order to achieve this object, an open MRI magnet system according to the invention is characterized in that at least one of the functional connections of the first gradient coil unit extends through the central passage of the first housing.

In order to achieve this object, a medical imaging system according to the invention is characterized in that the open MRI magnet system used therein is an open MRI magnet system in accordance with the invention.

In this way the at least one functional connection for the first gradient coil unit does not have to penetrate the space between the two housings, thus leaving the maximum amount of space available for objects such as patients. This is advantageous both in respect of the available space and in respect of safety and acoustic noise which may be generated by those functional connections.

According to a preferred embodiment of the invention the at least one functional connection for the first gradient coil unit comprises an electrical connection for electrically energizing the first gradient coil unit. In this way the electrical connection, for example embodied as power cables, is directed parallel to the field lines of the main coil unit. This means that during operation the Lorenz forces acting on the electrical connection will be practically zero. In this manner the electrical connection remains stationary during operation, which causes both mechanical fatigue of the cable connectors and the need for the usual measures for reducing mechanical restraint and acoustic noise to be reduced.

According to another preferred embodiment of the invention, the at least one functional connection for the first gradient coil unit comprises a cooling connection for conducting a cooling medium for the cooling of the first gradient coil unit. Apart from the above-mentioned advantage of the very efficient use of the available space, this gives the additional advantage that the cooling medium, such as water or air, can approach the first gradient coil unit centrally allowing homogeneous cooling of this gradient coil unit.

In order to be able to use short functional connections and to use the available space as efficiently as possible, the at least one functional connection for the first gradient coil unit is preferably connected to the first gradient coil unit at a side of the first gradient coil unit facing away from the imaging volume.

If the first gradient coil unit essentially shuts off the side of the central passage which is directed to the imaging volume, this first gradient coil unit will be able to perform its task of generating a switchable magnetic field, which is more or less linear in space, within the imaging volume in an even more optimal way.

For several reasons it can be very advantageous if the first gradient coil unit comprises a further central passage having a diameter smaller than 10 cm. Such a further central passage in the first gradient coil unit allows several useful applications. For example a laser beam can be transmitted through this further central passage, thus making it possible to point to a certain location at a patient's body with a laser beam. Another useful application relates to the mechanical manipulation of the second gradient coil unit using a cable or the like which extends through the further central passage in the first gradient coil unit.

Preferably the central passage has a diameter smaller than 50 cm. The diameter of the central passage can be relatively small since there is no need for transporting a patient therethrough to the imaging volume, as is the case in the open MRI magnet system according to EP 0 770 883 A1. This means that the main coil unit is present relatively close to the axis of the ring shape thereof, due to which fact it is less difficult to create a homogeneous magnetic field within the imaging volume. The central passage is only present to accommodate functional components and its diameter can therefore be adapted to the functional components which the central passage should accommodate.

A constructionally very simple configuration is achieved when the first gradient coil unit is essentially disc-shaped.

Alternatively the first gradient coil unit may be essentially conical-shaped.

BRIEF DESCRIPTION OF THE DRAWINGS

The invention may take form in various components and arrangements of components, and in various steps and arrangements of steps. The drawings we only for purposes of illustrating the preferred embodiments and are not to be construed as limiting the invention.

The present invention will now be described, by way of example, with reference to the accompanying drawings in which:

FIG. 1 is a schematic diagram of a first preferred embodiment of an open MRI magnet system according to the invention, FIG. 2 is a schematic diagram of a second preferred embodiment of an open MRI magnet system according to invention.

Detailed Description

FIG. 1 schematically shows a first preferred embodiment of an open MRI magnet system 1 according to the invention. The open MRI magnet system 1 is a part of a medical imaging system according to the invention. The remaining parts of the medical imaging system, including a frame, a patient support unit, and a control unit, are not shown in FIG. 1 and may be of a usual kind known to the skilled person. The open MRI magnet 1 is mainly mirror-symmetrical, both horizontally and vertically, and comprises an upper housing 2, and a lower housing 3. The housings 2, 3 are mainly ring-shaped and each have a central cylindrical passage 4, 5 having a diameter of approximately 30 cm. Between the housings 2 and 3 a spherical imaging volume 6 is present having a diameter of about 40 cm. An object such as a patient can be placed and moved within the imaging volume 6 between the two housings 2, 3 in order to be able to create, with the aid of the open MRI magnet system 1, an image of the object. For this purpose the open MRI magnet system 1 comprises a number of coil units in order to create a suitable magnetic field within the imaging volume 6. Within each of the housings 2, 3 a main coil unit is present, which main coil units are not shown in FIG. 1. On the sides facing each other, the housings 2, 3 are each provided with a disc-shaped recess 7, 8. The cylindrical passages 4, 5 are in open connection with the disc-shaped recesses 7, 8. Within each disc-shaped recess 7, 8 a gradient coil unit 9, 10 and a RF coil unit 11, 12 are present. The functions of the main coil units, the gradient coil units 9, 10 and the RF coil units 11, 12 are known to the person skilled in the art and will not be explained any further. Whereas the main coil units generate a permanent main magnetic field, the gradient coil units 9, 10 are electrically energized in order to create gradients of the main magnetic field. For this purpose, for each gradient coil unit 9, 10 an electrical cable 13, 14 is connected to the associated gradient coil unit 9, 10. The electrical cables 13, 14 are connected to the sides of the gradient coil units 9, 10 facing away from the imaging volume 6 and extend from these points through the cylindrical passages 4, 5 parallel to the central axis thereof. Due to this configuration the electrical cables run parallel to the main magnetic field lines, causing the Lorenz forces, exerted on the electrical cables during operation, to be practically zero. This results in a reduction of the acoustic noise and less mechanical fatigue of the electrical cables 13, 14. Besides the electrical cables 13, 14 also cooling channels 15, 16 extend essentially coaxially through the cylindrical passages 4, 5 parallel to the magnetic axis. Through these cooling channels 15, 16 a cooling medium, such as water, is transported to and from the gradient coil units 9, 10 for cooling purposes. Also the cooling channels 15, 16 connect to the associated gradient coil units 9, 10 at the side of the gradient coil units 9, 10 facing away from the imaging volume 6. Since none of the cables 13, 14 and channels 15, 16 penetrate the imaging volume 6, the maximum amount of volume will be available for a patient, thus allowing a relatively limited distance between the housings 2 and 3. In the present embodiment, this distance is about 45 cm.

The second preferred embodiment of an open MRI magnet system 21 in accordance with the invention as shown in FIG. 2 corresponds to a certain extent to that of the open MRI magnet system 1 of FIG. 1. Like the open MRI magnet system 1, the open MRI magnet system 21 comprises an upper housing 22 and a lower housing 23 each having a cylindrical passage 24, 25. Between the housings 22, 23 an imaging volume 26 is present in which a patient can be placed. Within each of the housings 22, 23 a main coil unit, which is not shown, is present. Furthermore the open MRI magnet system 21 is provided with two gradient coil units 29, 30 and two RF coil units 31, 32 which mainly surround the gradient coil units 29, 30. The assemblies of the gradient coil units 29, 30 with the RF coil units 31, 32 are conically shaped and, in order to be able to accommodate these assemblies, the housings 2, 3 are each provided with a conically shaped recess 27, 28 at the sides of the housings 22, 23 facing each other. Electrical cables 33, 34 and cooling channels 35, 36 are connected to the gradient coil units 29, 30 at the top of the conical shape thereof. Just like disc-shaped gradient coil units 9, 10 of the open MRI magnet system 1, conical-shaped gradient coil units 29, 30 shut off the central cylindrical passage 24, 25 at the side of the imaging volume 26.

Although the invention has been described referring to open MRI magnet systems in FIGS. 1 and 2 having a horizontal orientation with a vertical magnetic field orientation, it should be understood that also MRI magnet systems having a vertical orientation with a horizontal magnetic field orientation are included within the scope of the invention.

Although not illustrated in FIGS. 1 and 2, it is noted that it is possible within the scope of the invention to use the central passage of at least one of the two housings also as a feed-through for electrical RF cables for energizing RF coil units 11, 12. Within this passage also shim irons or shim coils could be accommodated. The central passage furthermore enables unique attachment features for the gradient coil units to be attached to the associated housing. For this purpose resilient members may be present between the gradient coil unit and the associated housing. Finally it is noted that the central passage can also be used as a cooling conduit itself for the open MRI magnet system or more specifically for the gradient coil units, or that it may accommodate cooling ducts for cooling air.

The invention has been described with reference to the preferred embodiments. Modification and alteration may occur to others upon reading and understanding the preceding detailed description. It is intended that the invention be constructed as including all such modification and alterations insofar as they come within the scope of the appended claims or the equivalents thereof.

The invention claimed is:

1. An open MRI magnet system comprising:
   a first mainly ring-shaped main coil unit and a second mainly ring-shaped main coil unit extending parallel and at some distance from each other and defining therebetween an imaging volume;
   a first housing and a second housing which accommodate respectively the first main coil unit and the second main coil unit, at least the first housing having a central passage;
   a first gradient coil unit and a second gradient coil unit associated respectively with the first main coil unit and the second main coil unit, the first gradient coil unit and the second gradient coil unit respectively being positioned between the associated main coil unit and the imaging volume;
   each gradient coil unit being provided with a cooling connection, at least one of the cooling connections extending through the central passage of the first housing for conducting a cooling medium for the cooling of the first gradient coil unit.

2. An open MRI magnet system as claimed in claim 1, wherein the first gradient coil unit closes the central passage.

3. An open MRI magnet system as claimed in claim 1, wherein the first gradient coil unit is essentially disc-shaped.

4. An open MRI magnet system as claimed in claim 1, wherein the first gradient coil unit is essentially conical-shaped.

5. A medical imaging system comprising an open magnetic resonance imaging (MRI) magnet system including:
   a first ring-shaped main coil unit;
   a second ring-shaped main coil unit extending parallel and a distance from the first ring-shaped main coil unit to define an imaging volume therebetween;
   a first ring-shaped housing enclosing the first main coil unit and defining a central passage therethrough;
   a second ring-shaped housing enclosing the second main coil unit;
   a first gradient coil unit mounted between the first housing and the imaging volume;
   a second gradient coil unit mounted between the second main coil unit and the imaging volume;
   each gradient coil unit being provided with functional connections, at the functional connections including at least one of an electrical line and a coolant line which convey one of electrical energizing power and a cooling medium through the central passage of the first and second ring-shaped housings without extending between the first and second main coil units and the imaging volume to supply each gradient coil unit with at least one of the electrical energizing power and the cooling medium from outside the first and second main coil units.

6. An open MRI magnet system as claimed in claim 5, wherein the at least one functional connection line of the first gradient coil unit comprises an electrical connection line extending parallel to the magnetic field lines for electrically energizing the first gradient coil unit.

7. An open MRI magnet system as claimed in claim 5, wherein the at least one functional connection line of the first gradient coil unit is connected to the first gradient coil unit at a side of the first gradient coil unit facing away from the imaging volume.

8. An open magnetic resonance magnet system comprising:
   a first annular main coil unit enclosed in a first annular housing which surrounds and defines a central passage therethrough, the central passage extending parallel to magnetic field lines of the first main coil unit, the first housing defining an annular recess around the central passage facing an imaging volume;
   a second annular main coil unit disposed parallel to the first main coil unit on an opposite side of the imaging volume, the second main coil unit enclosed in a second housing different from the first annular housing;
   a first gradient coil unit disposed in the first housing recess;
   at least one functional connection connection line extending through the central passage of the first annular housing parallel to the magnetic field lines from outside the first annular housing and connecting with the first gradient coil unit on a side away from the imaging volume; and
   a second gradient coil unit disposed on an opposite side of the imaging volume from the first gradient coil unit.

9. An open MRI magnet system as claimed in claim 8, wherein the first gradient coil unit defines a gradient coil central passage therethrough having a diameter smaller than 10 cm, the gradient coil central passage being aligned with the central passage of the first main coil unit.

10. An open MRI magnet system as claimed in claim 8, wherein the central passage has a diameter smaller than 50 cm.

* * * * *